United States Patent [19]

Ugenti

[11] Patent Number: 4,837,502
[45] Date of Patent: Jun. 6, 1989

[54] COMPUTER-AIDED, LOGIC PULSING PROBE FOR LOCATING FAULTY CIRCUITS ON A PRINTED CIRCUIT CARD

[75] Inventor: Michael Ugenti, Melville, N.Y.

[73] Assignee: Grumman Aerospace Corporation, Bethpage, N.Y.

[21] Appl. No.: 548,612

[22] Filed: Nov. 4, 1983

[51] Int. Cl.⁴ .................. G01R 1/30; G01R 31/08
[52] U.S. Cl. ...................... 324/73 PC; 324/523; 324/537; 324/149
[58] Field of Search .......... 324/73 PC, 73 AT, 73 R, 324/51, 72.5, 149, 133, 523, 537; 371/20, 21

[56] References Cited

U.S. PATENT DOCUMENTS

| | | | |
|---|---|---|---|
| 4,196,386 | 4/1980 | Phelps | 324/73 PC |
| 4,345,201 | 8/1982 | Thompson et al. | 324/149 X |
| 4,465,972 | 8/1984 | Sokolich | 324/73 PC X |

*Primary Examiner*—Stanley T. Krawczewicz
*Attorney, Agent, or Firm*—Richard G. Geib; Daniel J. Tick; Bernard S. Hoffman

[57] ABSTRACT

A system is described for locating faulty integrated circuits on a printed circuit card under the guidance of computer programmed in accordance with the circuit being tested. The disclosed system includes a current pulsing network allowing digital selection, as by the computer, of reference voltage levels at which current is injected into the circuit being tested.

16 Claims, 3 Drawing Sheets

COMPUTER-AIDED, LOGIC PULSING PROBE FOR LOCATING FAULTY CIRCUITS ON A PRINTED CIRCUIT CARD

BACKGROUND

This invention relates in general to circuit testing, and in particular to circuit testing systems for locating faulty digital integrated circuits.

Numerous circuit testing systems have been proposed to facilitate streamlined test procedures and reliable identification and location of faulty circuit components. In general, state-of-the-art test procedures prescribe the application of a predetermined test signal to the circuit being tested, then analyzing the response to determine the existence and location of faulty nodes. Once such nodes are identified, the general procedure is to inject an electric current into the node and to check the associated branches to determine which such branch is shorted.

Regarding the analysis of a response to applied test signals, U.S. Pat. No. 4,204,114, issued to Shoemaker et al, discloses a computer based system which acquires a reference signal from a known good circuit. The second test phase is illustrated by U.S. Pat. Nos. 4,074,188 and 4,345,201, issued to Boatman et al and Thompson et al respectively, both of which teach the detection of an injected current by means of an inductive probe with a ferrite core.

Other prior art teachings relevant to the present invention are B. Bronson and A. Chan, "A Multifunction, Multifamily Logic Pulser," Hewlett Packard Journal Volume 28, No. 4, October 1975, pp 12–16; and V. L. Creveling and R. E. Jones, "Signal Monitoring and Control Circuit for Semiconductor Device Test Probe," IBM Technical Disclosure Bulletin Volume 17, No. 11, April 1975, pp 3277–3278. Bronson and Chan teach the use of a voltage comparator feedback loop to control the timing of high and low logic level current pulses. Creveling and Jones suggest the use of a FET switch array to permit selection of different power sources for a given test channel.

A shortcoming of prior art circuit testing systems is their failure to allow precise control over the voltage levels at which current is injected into the circuit being tested while providing frequency discrimination of the injected current.

SUMMARY OF THE INVENTION

Accordingly, it is a principal object of the present invention to provide a logic pulsing device which allows the voltage at which current is injected to be selected with considerable precision.

Another object of this invention is to allow a current sensing device to respond only to the injected current and no other currents that may be present in a circuit under test.

It is yet a further object of this invention to provide a current pulsing network which is compatible with existing circuit testing systems.

Yet another object of this invention is the provision of such a network which is further: adaptable to computer aided test systems.

One still further object is to provide such a network which will allow the voltage levels to be incorporated into a programmed test procedure.

Realization of the above and other objects is accomplished in brief by regulating the supply voltage to at least one current driver the output of which supplies current pulses. The current driver saturates in response to pulses on its input. Regulation of the supply voltage is by means of a digital data register for storing a digital representation of the desired voltage level of the injected current and a digital-to-analog converter responsive to the data register.

The same reference voltage used to supply the current driver is used to derive a threshold voltage for a voltage comparator feedback loop which controls the width of the injected pulses in accordance with the impedance of the circuit being tested.

In the illustrative embodiment, dual current injecting current drivers are employed, allowing current pulses to be injected at two different reference voltage levels, typically the low and high logic levels of the circuit being tested. Thus, the present invention may be used to test circuits employing any type of logic, and is not limited to logic families, such as TTL and CMOS, which utilize roughly equivalent logic levels.

BRIEF DESCRIPTION OF DRAWINGS

A better understanding of the present invention may be had with reference to the appended drawings, in which:

FIG. 6 shows a view from the video display of FIG. 1 illustrative of a typical test procedure.

DETAILED DESCRIPTION OF PREFERRED EMBODIMENT

Figure 1:
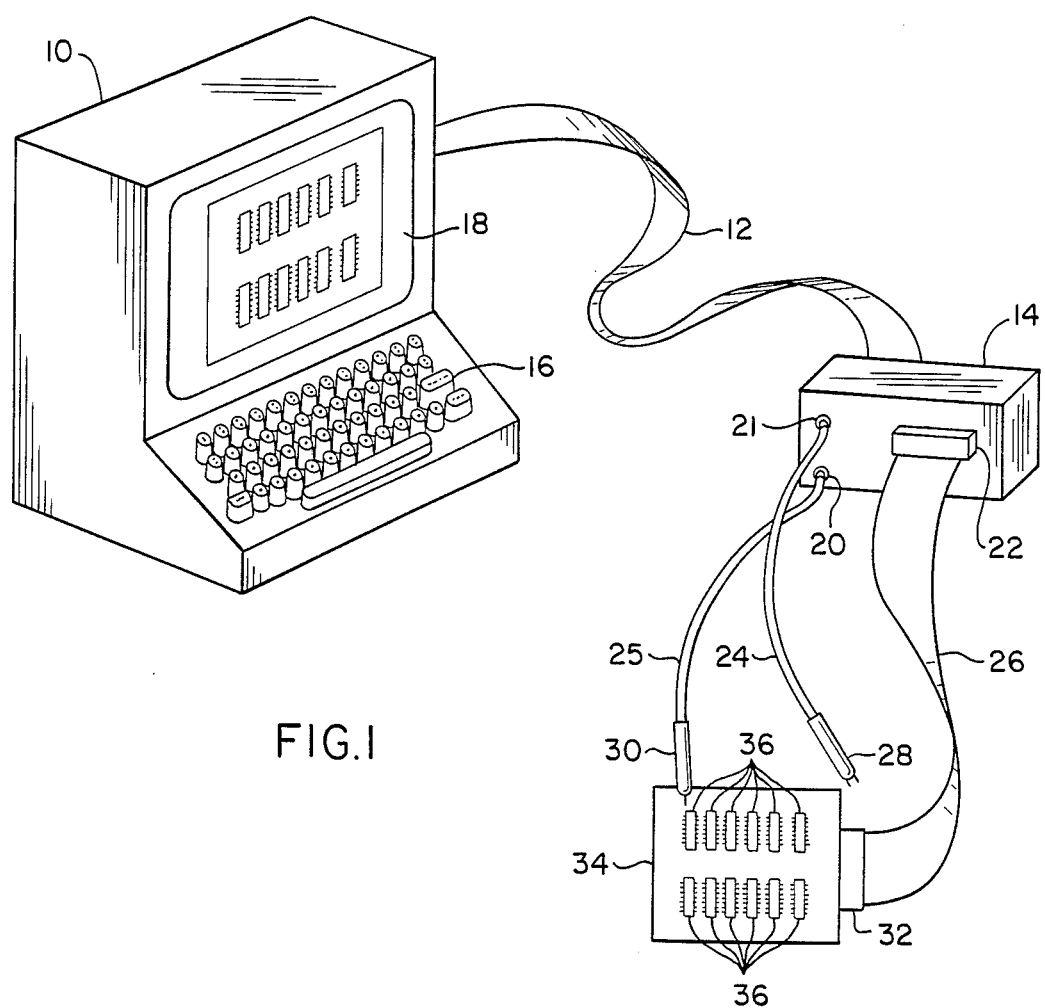
FIG. 1 is a perspective view of a system embodying the present invention.

The major components of a circuit testing system incorporating the present invention are illustrated in FIG. 1. Programmable computing means 10, typically a microcomputer, communicates, as indicated by ribbon cable 12, with an interface unit 14. As shown, computer 10 includes a keyboard input 16 and a video display 18, and interface unit 14 includes connecting ports 20–22 for probe cables 24 and 25 and parallel ribbon cable 26. In turn, cables 24, 25 are connected to hand held probes 28 and 30 respectively and parallel cable 26 terminates in an edge card plug 32.

The printed circuit card 34 to be tested typically includes a multiplicity of integrated circuit chips 36 and an edge card terminal. The standardized plug allows the circuit card 34 to be conveniently inserted into or removed from, as for testing, system enhancement, or repair, a corresponding edge card receptacle in a host device employing the card. As shown, card 34 is connected to plug 32 to allow transmission of predetermined test signals and responses over cable 26.

In a preferred system, application of the predetermined test signals to the input conductors, and interpretation of the responses sensed on the output conductors, of the edge card is controlled by computer 10. Thus, a program for computer 10 corresponding to the specific circuitry of card 34 must appropriately embody the predetermined test signals and associated response analysis logic. Such a program may be derived in part by applying test signals to a known good circuit and recording the response, as described in the Shoemaker et al patent, supra. Another consideration in the programming of computer 10 is compatibility with the hardware of interface unit 14. Those skilled in the art will appreciate that interface unit 14 will include data buffers, timing logic, voltage supplies, etc, each associated with appropriate conductors in cable 26, to allow simulated operation of the host device.

Probes 28 and 30, in a preferred system embodying the present invention, each have a tip sized to allow positioning by a user of the system over the individual pins of circuit chips 36. Use of the probes in a given test procedure, then, allows access to nodes and branches on the circuit card 34 which are not connected directly to the edge card plug, facilitating the precise identification of faulty chips. The construction and associated circuitry of each probe makes possible a generalized test procedure adaptable to a variety of circuit cards.

Figure 2:
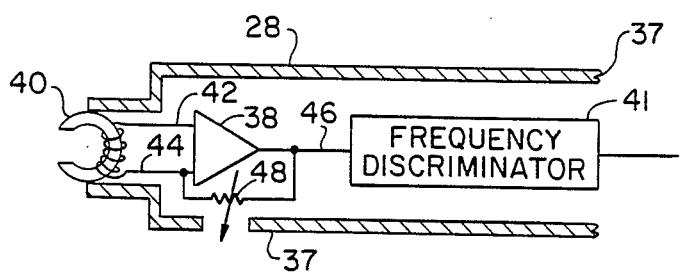
FIG. 2 is a somewhat schematic drawing showing in greater detail the inductive pick-up probe of FIG. 1.

A preferred form for probe 28—an inductive pick-up probe—is shown in FIG. 2. Within the housing 37 of probe 28 is a voltage amplifier 38 responsive to a wound ferrite core 40 forming the tip of the probe and a frequency discriminator 41 arranged to sense a predetermined frequency of the injected current, preferably on the order of 10 $H_z$. A flow of current in the vicinity of core 40 causes a voltage change across leads 42, 44, which is amplified to the output 46 of amplifier 38 and in turn frequency discriminated for processing by appropriate circuitry in interface unit 14. The sensitivity of inductive pickup probe 28 is adjustable by means of a variable resistor 48 in the feedback loop of amplifier 38. Preferably, resistor 48 is adjustable manually as by a slide switch or the like mounted on housing 37.

The tip of probe 30 is preferably a spring loaded electric conductor which may be connected, by means of a switch, to one of several functional networks. Such switch may be located in the probe 28 housing for manual operation by the user or in interface unit 14 under the control of computer 10. Each of the functional networks of probe 28 may include a high impedance contact detection circuit to insure good electrical contact with the circuitry being tested on card 34. Another desirable 10 capability of probe 28 may be provided by including a logic sensing network to allow test signal responses to be read at any point on the circuit card.

Figure 3:
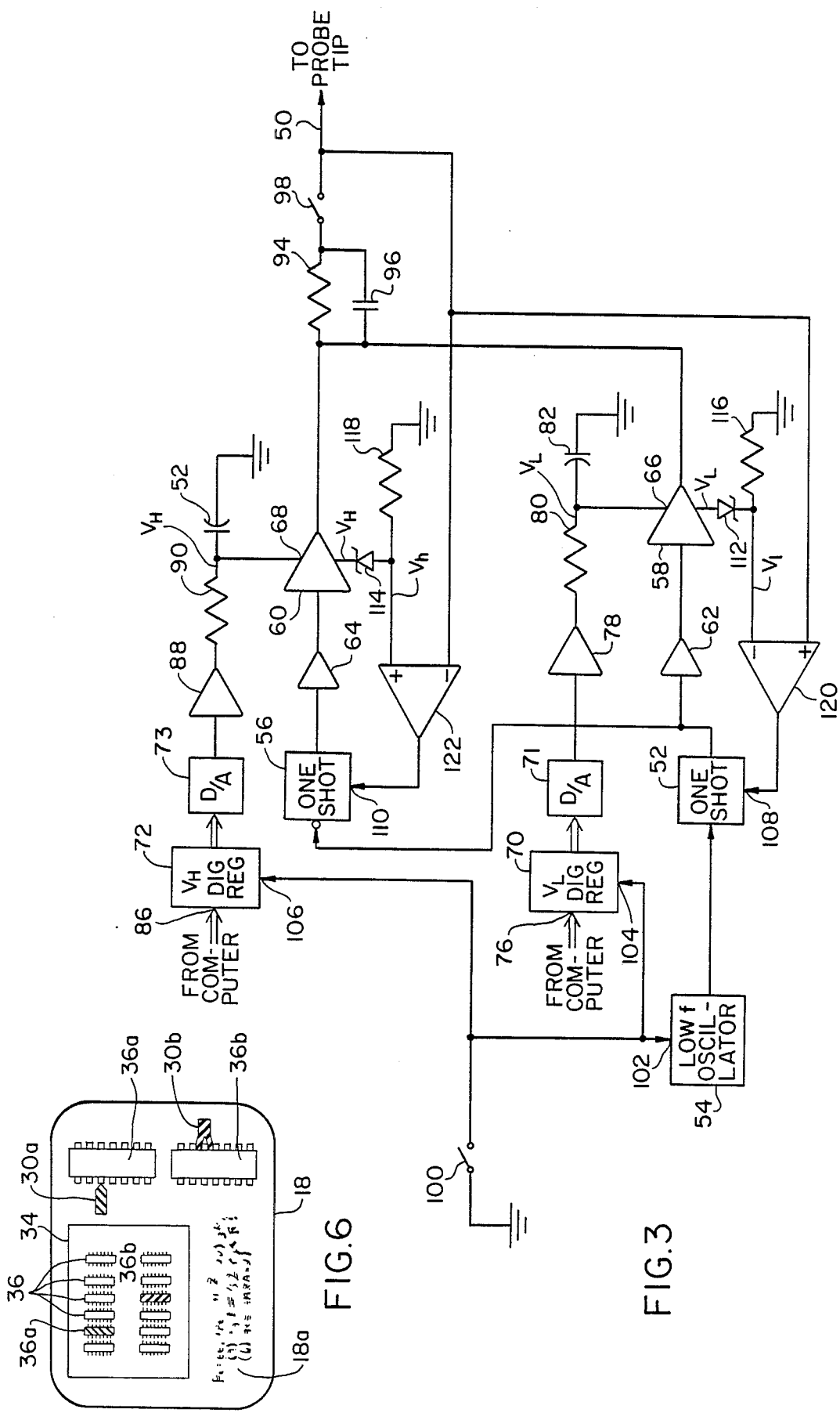
FIG. 3 is a detailed circuit diagram of a current injection network associated with the conductive probe of FIG. 1.

FIG. 3 shows in detail a circuit diagram for another functional network which in accordance with this invention may be connected to the tip of probe 30 to provide current injection capability. In a preferred system embodying the present invention, current output 50 of the FIG. 3 current injection network would be connected to the probe 30 function select switch described above.

With further reference to FIG. 3, pulse generating means consists of a first monostable multivibrator (one-shot) circuit 52 triggered by low frequency oscillator 54, a second one-shot 56 triggered by the first one-shot 52, and first and second tri-state current drivers 58 and 60 responsive to the respective one-shots. In addition to current drivers 58 and 60, the pulse amplifier means may include buffers or pre-amplifiers 62 and 64 as shown.

Current drivers 58 and 60 are arranged to saturate in response to pulses from their associated one-shot triggers 52, 56. The saturation output for each current driver is dictated by its supply voltage input, indicated by 66 and 68. As shown, supply input 66 to current driver 58 is responsive to a low logic level $V_L$, and supply input 68 to current driver 60 is responsive to a high logic level $V_H$. Derivation of logic levels $V_L$ and $V_H$ is by respective digital data register/digital-to-analog converter (D/A) combinations 70, 71 and 72, 73.

As shown, $V_L$ register 70 has a parallel load input 76 responsive to computer 10, and D/A 71 in turn converts the data word in register 70, corresponding to the low logic level, to an analog voltage. The reference voltage means may also include a buffer amplifier 78 for the output from D/A 71, and a series-resistor 80 and capacitor 82 to ground for storing energy during non Z0 pulse times. The high logic level reference voltage means consists of digital register 72 having a load input 86, buffer amplifier 88 responsive to D/A 73, and resistor 90 and capacitor 92 which all function identically with the like named elements in the low reference voltage means.

The outputs from tri-state current drivers 58 and 60 are connected to filter means consisting of a series resistor 94 and a capacitor 96 connected in parallel with the resistor. The filter means is preferably connected to current output 50 by another switch 98 in the probe 30 housing, allowing a probe contact circuit (not shown) connected to node 50 to operate without the necessity of simultaneously injecting current through the tip of probe 30. The computer 10 may also control injection of current, as by a switch 100 in the interface unit connected to enable inputs 102, 104 and 106 on oscillator 54 and registers 70 and 72 respectively.

One-shots 52 and 56, upon being triggered, produce a high pulse of predetermined duration at their respective outputs, as is conventional for one-shot circuits. In addition, one-shots 52 and 56 each include, as shown at 108 and 110, a pulse disable input. The output of each one-shot is arranged to be driven low in response to a high-to-low transition on the associated pulse disable input.

Feedback loops responsive to the voltage at current output 50 are used to derive pulse disable signals, as shown, for one-shots 52 and 56. Threshold voltages $V_l$ and $V_h$ are derived from respective logic level reference voltages $V_L$ and $V_H$, as by zener diodes 112 and 114 and resistors 116 and 118 to ground. The reverse breakdown voltages for diodes 112 and 114 are chosen in accordance with desired offsets $V_l$-$V_L$ and $V_H$-$V_h$. Typically a low threshold offset between 0.5 and 1.0 V and a high threshold offset in the 0.7 to 1.5 V range will be used. The pulse disable signals to inputs 108 and 110 are taken from the outputs of corresponding voltage comparators 120 and 122, each having one input responsive to current output 50 and another output responsive to the corresponding threshold voltage.

Figure 4:
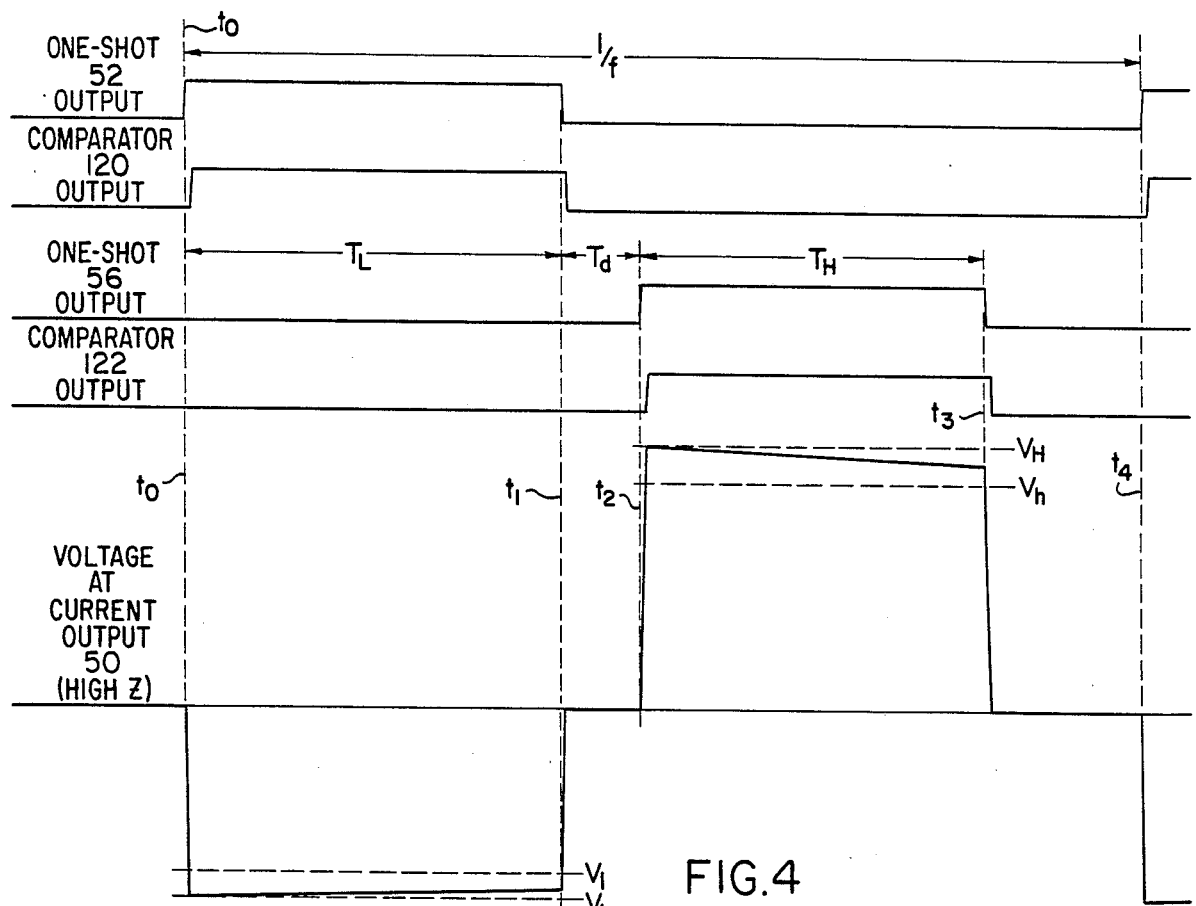
FIGS. 4 and 5 show waveforms from the circuit of FIG. 3.
Figure 5:
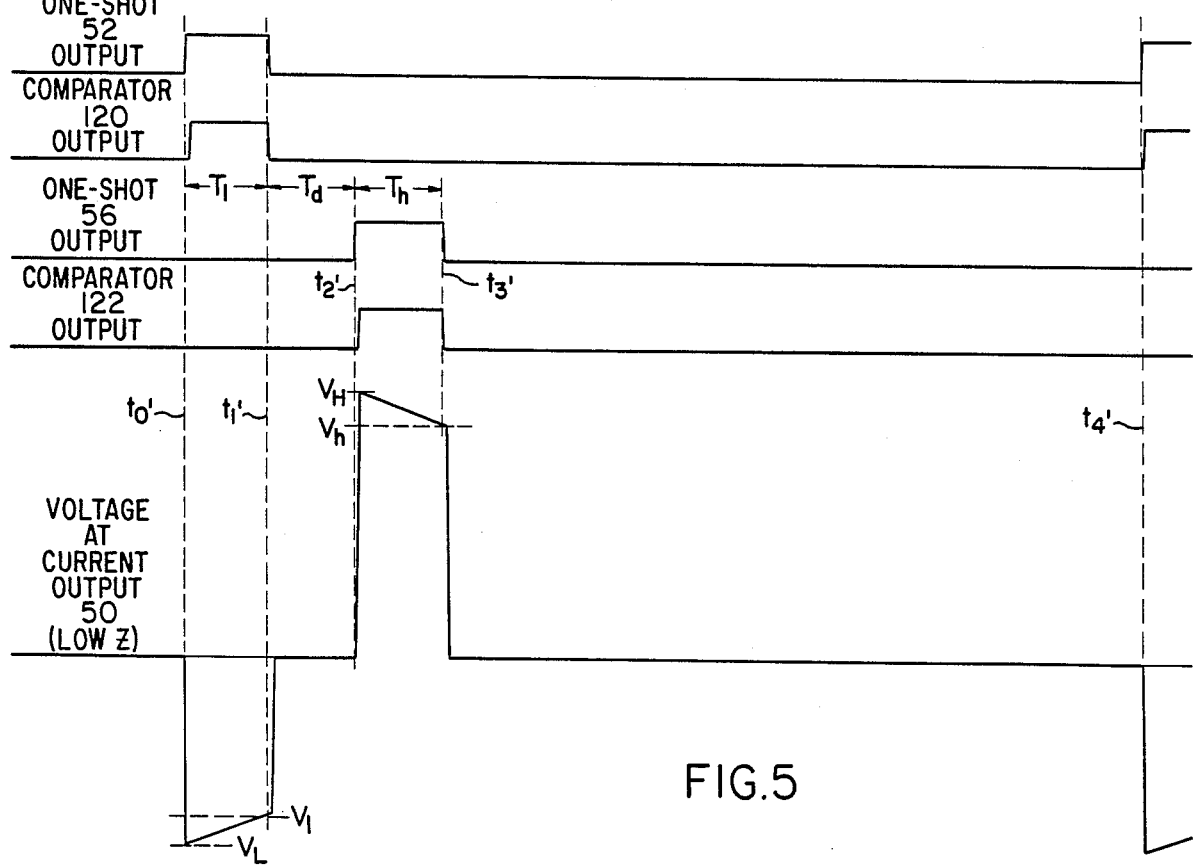

The operation of the FIG. 3 current injection network will be presently explained with reference to FIGS. 4 and 5. FIG. 4 shows the relative timing of current output 50 and the outputs from one shots 52, 56 and comparators 120, 122 for one period from oscillator 54 and probe 30 in contact with a high impedance. FIG. 5 shows the same signals for the tip of probe 30 in contact with a relatively lower impedance to ground.

Referring to FIG. 4 then, the one-shot 52 output goes high at time $t_o$, triggered by oscillator 54. As a result, amplifier 58 saturates and the voltage at current output 50 goes to $V_L$, in turn causing the output from comparator 120 to go high. Since the output 50 voltage remains below $V_l$, comparator 120 stays high and the low logic level pulse continues through the maximum duration permitted by the normal period T of one-shot 52. At time $t_l$, the one-shot 52 output reverts to low, causing the voltage at output 50 to return to 0 and, in turn, comparator 120 output to go low again.

Also as a result of the high to low transition on the one-shot 52 output, one shot 56 is triggered to output a high pulse. Preferably, one-shot 56 has a slight delay—shown as $T_d$—incorporated to insure that the low and high logic level pulses do not overlap. After time $T_d$, then, at $t_2$, one-shot 56 goes high, the voltage at output 50 goes to $V_H$, and the comparator 122 output goes high. As with the low pulse, the high pulse continues through the normal period $T_H$ of one-shot 56, since the output 50 voltage remains above $V_h$. At time $t_3$, when one-shot 56 goes low again, the output 50 voltage returns to 0 and comparator 122 output, in turn, drops back low.

Following the high logic level pulse, the output 50 voltage remains at 0 (or some other steady state voltage) until another pulse is triggered on one-shot 52. After period $1/f$, where f is the frequency of oscillator 54, another pulse cycle is seen to begin at time $t_4$. It will be appreciated that the maximum pulse width $T_L$ and $T_H$ must not, when summed with delay $T_d$, exceed the repetition period $1/f$.

In FIG. 5, the low impedance to ground illustration, the beginning of the cycle, $t_o'$, is again marked by one-shot 52 output triggering from low to high, and the consequential forcing of the output 50 voltage to the low logic level reference voltage $V_L$. Because of the lower impedance to ground, however, capacitor 96 charges more quickly, resulting in a rising voltage at output 50. At time $t_1'$ the output 50 voltage rises across threshold $V_1$, causing the comparator 120 output to switch to low, in turn disabling one-shot 52 and driving its output low. The low pulse thus terminates after shortened period $T_1$.

Again, as in the FIG. 4 example, the high-to-low transition on one-shot 52 causes a pulse to be triggered at $t_2'$ on the output of one-shot 56. Since it is programmed into one-shot 56, the same delay $T_d$ will separate the low and high pulses, regardless of the shortened periods of the actual pulses themselves. As at $t_2$, the one-shot 56 pulse at $t_2'$ causes amplifier 60 to saturate and the supply voltage $V_H$ to appear at output 50. As with the low logic level pulse, however, the low impedance results in a shorter pulse period $T_h$ as capacitor 96 discharges through the probe 30 tip and output 50 falls across the high threshold $V_h$ at time $t_3$. Until one-shot 52 is triggered again at $t_4'$ all of the outputs remain at their steady state levels.

From the foregoing, it will be appreciated that the period for each pulse will depend on the actual impedance in the circuit under test and the difference between the injection voltage level (i.e., $V_L$ or $V_H$) and the steady state node voltage. Typically, a node appearing to be faulty will be shorted to the circuit ground (as in the waveforms of FIG. 5) or to one of the circuit supply voltages. In practice, though, any steady state voltage within the range of the supply voltages may be observed if a node is partially shorted. It is anticipated that $V_L$ and $V_H$ will normally be selected to correspond to the logic levels of circuit card 34. Of course, the user is not limited to using standard logic levels as pulse reference voltages. The network of FIG. 2 may, for instance, be used to check logic level tolerances—actual voltages required to pulse gates to different states—for new circuit applications. Other advantages of the adjustability of the pulse levels will, no doubt, suggest themselves to those of skill in the art.

A preferred test procedure is best described by reference to FIG. 6, which shows the video display 18 of computer 10 at a particular point in the test procedure. Three general areas on display 18 show circuit card 34, enlarged integrated circuit chips 36a and 36b, and a message area 18a. The identification of chips 36a and b on card 34, illustrated by left and right cross hatching, may in practice be done by using different colors on display 18.

On applying predetermined test signals to card 34, either through cable 26 or probe 30, analysis of the response usually reveals the exact identity of any faulty nodes—typically such a node will be locked in a zero or one logic state. Incorrect operation at the faulty node is normally the result of a short in a gate having an input or output connected to the faulty node. Since many gates on different circuit chips may be connected to a faulty node, more refined testing is necessary to identify a single faulty IC chip. In accordance with the present invention such testing is accomplished by using probe 30 to inject current pulses into the faulty node, then locating the branch from the faulty node which draws all the injected current using probe 28. Normally current is injected at the node drive (outputting gate) and checked at the receiving inputs of the driven gates.

Referring again to FIG. 6, a faulty node on chip 36a is identified to the user by a cursor 30a, symbolic of probe 30. Each branch associated with the faulty node is in turn identified by another cursor 28a symbolic of probe 28. Prior to testing for the injected current in the designated branches, the user would adjust the gain of probe 28 by means of feedback resistor 48 (FIG. 2) to insure that no false readings due to currents in nearby branches will be registered. This adjustment would be made with both probes held at the faulty node. The message area 18a allows the user to be prompted for various test procedures and kept informed of the status of the test.

It will be appreciated that the foregoing described system and test procedures may be modified in numerous details. The scope of the present invention, then, is to be interpreted only by the claims which follow.

What is claimed is:

1. A device for injecting electric current into a node of a circuit being tested, said device comprising:
   pulse generating means responsive to at least one reference voltage;
   filter means for connecting the pulse generating means to the node;
   at least one data register in one-to-one correspondence with the reference voltage; and
   at least one digital-to-analog converter in one-to-one correspondence with the data register and the reference voltage, said converter being responsive to the corresponding data register and outputting the corresponding reference voltage.

2. The device of claim 1 which further comprises at least one differential comparator in one-to-one correspondence with the reference voltage, said comparator having a first input connected to the node and a second input responsive to a predetermined threshold voltage derived from the corresponding reference voltage, the pulse generating means being responsive to an output from said comparator.

3. The device of claim 1 in which the filter means comprises:

a resistor: and a capacitor connected in parallel with the resistor.

4. The device of claim 1 in which the pulse generating means comprises:

a low frequency oscillator;

a feedback means;

trigger means responsive to the oscillator and the feedback means; and current pulse generating means responsive to the trigger means and the reference voltage.

5. The device of claim 4 in which the feedback means comprises at least one voltage comparator in one-to-one correspondence with the reference voltage, said comparator having a first input responsive to the node and a second input responsive to a predetermined threshold voltage related to the corresponding reference voltage by a corresponding constant offset voltage, the trigger means being responsive to an output from said comparator.

6. The device of claim 5 in which the trigger means comprises at least one one-shot circuit in one-to-one correspondence with the comparator and the reference voltage.

7. The device of claim 6 in which the current pulse generating means comprises at least one tri-state current driver in one-to-one correspondence with the one-shot circuit, said tri-state current driver saturating in response to pulses from the corresponding one-shot circuit, a saturation output of said tri-state current driver being dictated by the corresponding reference voltage.

8. The device of claim 1 which further comprises computer means for generating at least one digital signal in one-to-one correspondence with the data register, said digital signal representing desired levels of the reference voltage, the data register being responsive to said digital signal.

9. In a computer-aided circuit testing system having means for detecting a flow of electric current through designated branches of a circuit being tested, said current being injected into a specified node of the circuit by current pulse generating means responsive to a voltage comparator feedback loop for controlling injected current pulse widths, an improved network for controlling at least one reference voltage at which said current is injected, said network comprising:

digital register means for storing at least one data word in one-to-one correspondence with the reference voltage, said data word representing a desired value of the corresponding reference voltage; and digital-to-analog converter means responsive to the digital register means for outputting the reference voltage.

10. The improved network of claim 9 which further comprises:

oscillating means for triggering the current pulse generating means to output a train of current pulses at a predetermined frequency; and enabling means for controlling the generation of the current pulses, the oscillating means and the digital register means being responsive to said enabling means.

11. The improved network of claim 9 in which the voltage comparator feedback loop includes at least one voltage comparator in one-to-one correspondence with the reference voltage, said comparator having one input responsive to the node and another input responsive to a threshold voltage related to the corresponding reference voltage by a corresponding offset voltage.

12. The improved network of claim 11 in which the current pulse generating means includes at least one one-shot circuit in one-to-one correspondence with the reference voltage, said one-shot circuit outputting enabling pulses for controlling the injected current pulse widths, the enabling pulses being limited by a predetermined change in output polarity of the corresponding differential comparator.

13. A system for locating shorts on a printed circuit card, said system comprising injection means for injecting an electric current into a node of the printed circuit card;

detection means for detecting flow of the electric current through designated branches of the printed circuit card, said detection means comprising a hand held inductive probe having a voltage amplifier responsive to a wound ferrite core, the voltage amplifier having an adjustable gain, the ferrite core being sized to allow said probe to be positioned over a single pin of an integrated circuit chip; and reference voltage means for controlling high and low logic levels at which the electric current is injected into the node, the injection means being responsive to said reference voltage means.

14. A system for locating shorts on a printed circuit card, said system comprising injection means for injecting an electric current into a node of the printed circuit card, said injection means comprising a first one-shot circuit triggered by a low frequency oscillator and having an output arranged to be driven low by a high to low transition on a pulse disable input to said first one-shot circuit, a second one-shot circuit triggered by a high to low transition on the output of the output of the first one-shot circuit and having an output arranged to be driven low by a high to low transition on a pulse disable input to said second one-shot circuit, a first tri-state current driver responsive to the first one-shot circuit and having a supply voltage input responsive to the low logic level such that a voltage level of an output of said first tri-state current drive is substantially equal to the low logic level when the output from the first one-shot circuit is high, a second tri-state current driver responsive to the second one-shot circuit and having a supply voltage input responsive to the high logic level such that a voltage level of an output of said second tri-state current driver is substantially equal to the high logic level when the output from the second one-shot circuit is high, means for connecting the outputs from the first and second tri-state current drivers to a probe tip of the injection means, a first differential comparator having one input responsive to the probe tip and another input responsive to a low threshold voltage related to the low logic level such that when a voltage level at the probe tip rises across the low threshold voltage, an output of said first differential comparator goes from high to low, the pulse disable input of the first one-shot circuit being responsive to the output of said first differential comparator, and a second differential comparator having one input responsive to the probe tip and another input responsive to a high threshold voltage related to the high logic level such that when the voltage level at the probe tip falls across the high threshold voltage, an output of said second differential comparator goes from high to low, the pulse disable input of the second one-shot circuit being responsive to the output of said second differential comparator;

detection means for detecting flow of the electric current through designated branches of the printed circuit card; and reference voltage means for controlling high and low logic levels at which the electric current is injected into the node, the injection means being responsive to said reference voltage means.

15. A system for locating shorts on a printed circuit card, said system comprising injection means for injecting an electric current into a node of the printed circuit card;

detection means for detecting flow of the electric current through designated branches of the printed circuit card; and reference voltage means for controlling high and low logic levels at which the electric current is injected into the node, the injection deans being responsive to said reference voltage means, said reference voltage means comprising a first digital data register for storing a digital representation of the low logic level and having a load input for changing the low logic level, a first digital-to-analog converter responsive to the first digital data register and outputting the low logic level, a second digital data register for storing a digital representation of the high logic level and having a load input for changing the high logic level, and a second digital-to-analog converter responsive to the second digital data register and outputting the high logic level.

16. A system as claimed in claim 15, further comprising computer means programmed in accordance with predetermined test procedures for the printed circuit card to identify to a user of the system the node and designated branches on the printed circuit card, said computer means further being arranged to output digital representations of the high and low logic levels in accordance with characteristics of the printed circuit card, the load inputs of the first and second digital data registers being responsive to the digital representations of the high and low logic levels.

* * * * *